United States Patent [19]
Praschek et al.

[11] Patent Number: 5,296,674
[45] Date of Patent: Mar. 22, 1994

[54] LASER PROCESSING METHOD FOR A THIN-FILM STRUCTURE

[75] Inventors: Stefan Praschek; Wolfgang Riedl, both of Munich; Hans Goslowsky, Grafting, all of Fed. Rep. of Germany

[73] Assignee: Siemens Aktiengesellschaft, Munich, Fed. Rep. of Germany

[21] Appl. No.: 946,601

[22] Filed: Sep. 18, 1992

[30] Foreign Application Priority Data
Oct. 7, 1991 [EP] European Pat. Off. ......... 91117061.1

[51] Int. Cl.$^5$ .......................................... B23K 27/00
[52] U.S. Cl. ........................ 219/121.69; 219/121.68
[58] Field of Search ................... 219/121.68, 121.69

[56] References Cited

U.S. PATENT DOCUMENTS

| | | | |
|---|---|---|---|
| 3,560,258 | 2/1971 | Brisbane | 219/121.69 X |
| 3,637,410 | 1/1972 | Stevens | 427/554 |
| 4,190,759 | 2/1980 | Hongo et al. | 219/121.69 |
| 4,504,726 | 3/1985 | Hosakai et al. | 219/121.68 |
| 4,705,698 | 11/1987 | Van Dine | 219/121.69 X |

*Primary Examiner*—C. L. Albritton
*Attorney, Agent, or Firm*—Hill, Steadman & Simpson

[57] ABSTRACT

A method for eroding material, particularly material in a thin-film structure, that includes at least one thin-film arranged over at least one transparent layer, includes irradiating the thin-film with a laser pulse through the transparent layer. The laser pulse has a wavelength in the absorption region of the thin-film. The irradiated thin-film region, together with any layers lying above the thin-film region, are popped off, without any residue, from the transparent layer.

10 Claims, 1 Drawing Sheet

LASER PROCESSING METHOD FOR A THIN-FILM STRUCTURE

FIELD OF THE INVENTION

The present invention relates generally to a method for eroding material in a thin-film structure with a laser source.

BACKGROUND OF THE INVENTION

Laser processing methods for cutting or eroding material are known in many technological areas. Generally, a material to be processed is directly irradiated with laser light having a suitable wavelength. The energy from the laser light is absorbed by and coupled into the material in order to evaporate the material. The numerous applications of such processes can include, for example, cutting sheet steel, manufacturing microelectronic components, and structuring thin-film modules.

Laser processing methods have specific applications in structuring thin-film solar modules. For example, a photoactive semiconductor material can be applied across a surface and subsequently subdivided into a number of segments that are serially interconnected. Each of the individual layers of the thin-film structure, such as the front side electrode, the semiconductor layer, and the back side electrode, must be subdivided in order to structure the module surface. Considering the different absorption and dispersion properties of these superimposed layers and their boundary surfaces, lasers provide a suitable tool for such structuring.

However, in subdividing the module surface, the back side electrode is structured in the last step of the process. As a result, such laser processing methods are disadvantageous because the photoactive semiconductor layer lying directly under the back side electrode can be electrically damaged during the last processing step. Specifically, given solar modules composed of an amorphous semiconductor material, there is a risk of a phase conversion resulting from a highly electrically conductive connection between the front and back side electrodes. Further, an electrical short results when highly conductive regions in the semiconductor layer produce a connection between the front and back side electrodes. Further, other damage to the semiconductor layer, such as thermal stressing, also reduces the electrical power of the solar module.

In order to avoid a reduction in the electrical power of the solar module, a lift-off technique is typically used to structure the back side electrode in a thin-film solar module. Such a lift-off technique includes applying a thin line of paste to the active semiconductor layer before depositing the back side electrode on the semiconductor layer. The paste is then mechanically removed from the semiconductor layer after drying, and part of the back side electrode above the paste is also removed.

However, such a lift-off technique has a number of disadvantages. For example, a photo-inactive area having a width greater than 0.5 mm is produced, due to the width of the paste strip. Further, the adhesion between the back side electrode and the active semiconductor layer is locally diminished, due to the lift-off technique. In addition, the photoconduction of the active semiconductor layer can be deteriorated by chemical substances contained in the paste. Moreover, the structuring process of the back side electrode requires several different steps.

SUMMARY OF THE INVENTION

It is an object of the present invention to provide a simple and reliable laser processing method for structuring the back side electrode of thin-film solar cells without reducing the performance of the solar module. In so doing, the method of the present invention also provides a laser processing method that is suitable for material erosion in thin-film structures.

The above and other objects are inventively achieved in a method for laser-induced material erosion in a thin-film structure. A thin-film structure is provided having at least one thin-film. The thin-film structure is arranged over at least one transparent layer. The thin-film structure is then irradiated with a laser pulse having a wavelength in the absorption range of the thin-film, such that the thin-film structure is popped off the transparent layer in the region of the laser beam.

In contrast to known methods for eroding material with lasers, where the material is directly irradiated, the method of the present invention provides for indirectly irradiating a material through a transparent layer lying below the material. The transparent layer usually includes the substrate or the carrier layer of the thin-film structure. Thus, the term "transparent layer", as used herein, refers to a layer that is at least partially transmissive for the wavelength of the laser used, and whose coefficient of absorption is noticeably lower at this wavelength than is the coefficient of absorption of the thin-film. Thus, the laser energy is mainly absorbed in the thin-film in the proximity of the boundary surface to the transparent layer. Thus, in accordance with the principles of the present invention, the laser light need not pervade the entire layer thickness of the thin-film.

Blasting of specific regions of the thin-film covered by the laser beam with additional regions of the thin-film structure potentially lying above the thin-film covered by the laser beam is achieved by mechanical deformation, as a result of the coupled laser energy. Therefore, based on an appropriate dimensioning of the pulse length and the energy density of the laser beam, acceleration forces that cause bursting of the thin-film in this region are produced, due to the distortions at the boundary surface between the transparent layer and the thin-film. Further, as the coupling of the laser energy occurs rapidly, the temperature of the transparent layer is only slightly increased.

The kinetic energy released, in accordance with the principles of the method of the present invention, is adequate to explode, or pop off, the thin-film from the transparent layer without producing any residue. Thus, a complete material erosion in the region in which the laser pulse is focused can be achieved with a single laser pulse.

Further, an especially clean trench-shaped cutting line can be produced in the thin-film structure by providing a relative motion between the laser beam and the thin-film structure between individual pulses of the laser beam, such that focal spots produced by the laser partially overlap. Because the eroded material in the trench produced by overlapping focal spots is residue-free, the thin-film structure can be subdivided without producing bridges between subdivisions of the unremoved layer material. Thus, the method of the present invention is particularly advantageous when used to structure thin-film solar modules where bridges of unremoved material could produce conductive connections between regions of the solar module, causing deterioration of the module properties.

Additionally, the method of the present invention can be used to burst irradiated thin-film regions supported by a gravitational force, such that the layer structure is irradiated in a position relative to the horizontal where the transparent layer is above the layer structure. In all arrangements where the orientation of the thin-film structure deviates from vertical, it is particularly advantageous to arrange the transparent layer above the layer structure, with the horizontal arrangement of the layer structure being the most advantageous. Arranging the layer structure and transparent layer in this manner prevents the explosively-removed particles from falling back onto the thin-film structure, thereby preventing potential electrical shorts that would result if the explosively-removed particles fell back onto the thin-film structure.

The method of the present invention produces the most reliable results when used with a transparent layer having negligible absorption compared to the wavelength of the laser used, where the wavelength of the laser is simultaneously selected in the region of an absorption maximum of the thin-film. For example, in thin-film solar modules, the method of the present invention produces the most reliable results where the transparent layer includes a glass substrate having a transparent, conductive electrode (TCO layer) applied over the glass substrate, and where the thin-film structure includes at least the active semiconductor layer and potentially includes the back electrode layer positioned above the active semiconductor layer.

For highly absorbent thin-film materials irradiation can also be performed using a laser having a range relatively lower than the absorption range of the thin-film in order to avoid overheating.

Other advantages and features of the invention will be readily apparent from the following description of the preferred embodiments, the drawings and claims.

DETAILED DESCRIPTION

Figure 1:
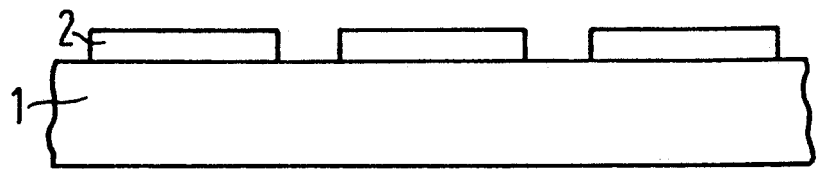
FIG. 1 illustrates a cross sectional view of a first stage of a thin-film solar module constructed in accordance with the principles of the method of the present invention.

FIG. 1 illustrates a cross sectional view of a first stage in structuring a thin-film solar module in accordance with the principles of the method of the present invention. A glass substrate 1 is provided. The glass substrate 1 can have a thickness of, for example, 2 mm. A front side electrode of thin, conductive oxide (TCO), such as a 1 $\mu$m thick layer of zinc oxide or fluorine-doped tin oxide, is deposited in a known manner on the glass substrate 1. An Nd:YAG laser is then used to directly irradiate the electrode layer, such that the electrode layer is subdivided into strip-shaped individual electrodes 2.

Figure 2:
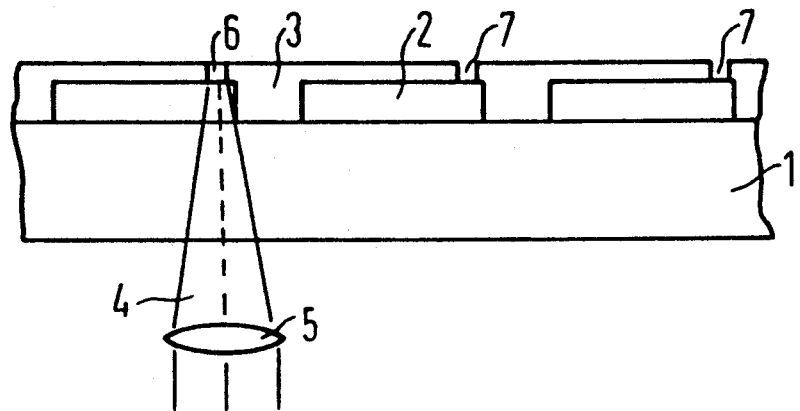
FIG. 2 illustrates a second stage in structuring a thin-film solar module in accordance with the principles of the method of the present invention.

As illustrated in FIG. 2, an active semiconductor layer 3 is then deposited over the strip-shaped electrodes 2. The active semiconductor layer 3 can include, for example, an amorphous silicon having a thickness of, for example, approximately 0.5 mm. The active semiconductor layer 3 is deposited, for example, with a RF glow discharge deposition process in hydrosilicon, where a pin structure is produced in the semiconductor layer 3 by adding dopant gases borane ($B_2H_6$) and phosphine ($PH_3$).

In order to subsequently serially interconnected the strip-shaped individual solar cells defined by the strip-shaped electrodes 2, the active semiconductor layer 3, which is photoactive, must also be structured in a strip-like manner. To this end, a pulsed laser having a wavelength lying in the spectral range of high absorption of the active semiconductor layer 3 is used in accordance with the principles of the method of the present invention. When the active semiconductor layer 3 is amorphous silicon, a blue or green laser is required for this purpose, such as a frequency-doubled Nd:YAG or Nd:YLF laser.

The active semiconductor layer 3 is irradiated through the glass substrate 1, where the laser pulse is focused on the active semiconductor layer 3 with a simple optical arrangement including a mirror (not illustrated) and a lens 5. With a focal length of, for example, 100 mm for the lens, an adequate depth of focus within a tolerance value of $\pm 1$ mm is achieved.

Because of the transparency of the substrate 1 and of the front side electrode 2, the laser emission 4 is only absorbed in the active semiconductor layer 3 at the boundary surface of the front side electrode 2. When the laser pulse length lies, for example, in the nanosecond range, the laser emission 4 produces mechanical stresses in the semiconductor layer 3. The mechanical stresses in the semiconductor layer 3 cause an exposed region 6 of the active semiconductor layer 3 to pop off, exposing the front side electrode 2.

Further, the semiconductor layer 3 is only slightly modified in phase due to the influence of heat caused by the irradiation, as determined by examining the fracture edges of the semiconductor layer 3 in the depressions 7. The thermal stressing of the boundary surface between semiconductor layer 3 and front side electrode 2 can, thus, be localized to the exploded layer region 6 and an edge region immediately adjacent to the exploded layer region 6 in the semiconductor layer 3 based on a Gaussian profile of the laser beam and of an optimally selected pulse energy. A radial intensity distribution of the laser beam with Gaussian profile is achieved when the $TEM_{00}$ mode is used in the method of the present invention. Further advantages are achieved using a rectangular beam profile. It is particularly advantageous to use a profile with which the intensity drops off steeply at the edge of the laser beam.

In order to produce trench-shaped cuts in a thin-film or in the semiconductor material 3, pulse repetition of the laser beam and simultaneous introduction of a relative motion between the laser beam and a workpiece, such as a future solar module, are used. Advantageously, the pulse frequency and the relative motion are matched such that the focal spots of the laser partially overlap. The semiconductor layer 3 can thereby be completely subdivided into regions that are separated with high impedance.

Suitable pulse frequencies range from 1 through 100 kHz, where the frequency is upwardly limited by the energy density of the laser pulses. The energy density of the laser pulses decreases with increasing frequency. The pulse frequency is also upwardly limited by eliminating heat from both the non-exploded regions of the semiconductor layer and the transparent layer. Although a major portion of the coupled energy is popped off with the irradiated layer region 6, a slight heating of the electrode layer 2 occurs in the irradiated region nonetheless.

In order to avoid excessive heating of the material, the length of the laser pulses are advantageously chosen to be less than 200 ns. Optimally suitable laser pulse lengths range between 20 ns and 100 ps.

In order to produce a relative motion between the laser beam and the module, the laser beam is deflected across the module in a defined manner, or the module is moved relative to the laser beam. The cutting speed is defined by the pulse repetition rate, the expanse of the laser beam in the moving direction, and the overlap of the focal spots produced.

Figure 3:
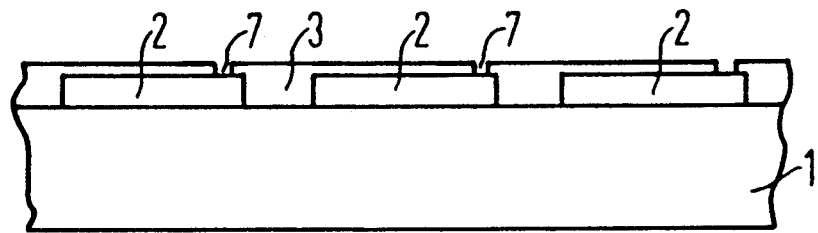
FIG. 3 illustrates a third stage in structuring a thin-film solar module in accordance with the principles of the method of the present invention.

FIG. 3 illustrates a cross sectional view of a third stage in structuring a solar module in accordance with the principles of the method of the present invention. The semiconductor layer 3 is completely separated into individual strip cells, due to the trenches 7 produced in accordance with the electrode strips 2. A suitable back side electrode 8, such as a metal film or a transparent TCO layer, is applied across the surface of the structure. In accordance with the principles of the method of the present invention, the back side electrode layer 8 is structured by irradiating the back side electrode layer 8 with a pulsed laser through the transparent substrate 1 and through the transparent front side electrode 2. In accordance with the structuring of the semiconductor layer 3, as set forth above, the laser is focused in the semiconductor layer 3, where the region of the back electrode layer 8 lying above the focal spot of the semiconductor layer 3 is popped off simultaneously with the semiconductor layer 3 in the region 9 of the focal spot.

Figure 4:
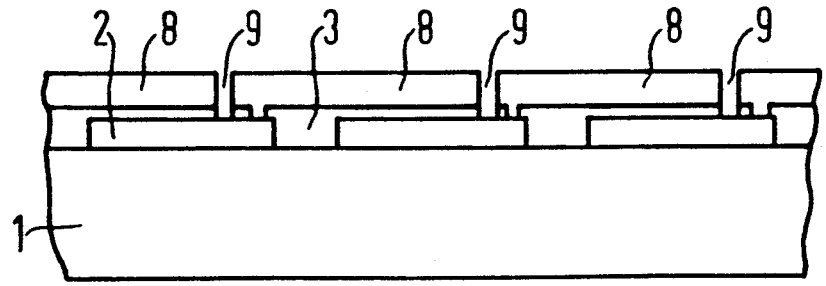
FIG. 4 illustrates a fourth stage in structuring a thin-film solar module in accordance with the principles of the method of the present invention.

FIG. 4 illustrates a finished solar module constructed in accordance with the principles of the method of the present invention. The individual strip cells are serially electrically interconnected, based on the corresponding structuring of the back side electrode 8.

A number of advantages result when the method of the present invention is employed, compared to the traditional lift-off technique. For example, only one structuring technique is used in accordance with the method of the present invention, as a structuring of the individual layers occurs uniformly. Further, the photoactive area is enlarged compared to the photoactive area in the traditional lift-off technique, as the parting trenches between the regions can be limited to 30–50 $\mu$m in width. Moreover, adhesion problems of the back side electrode on the active semiconductor layer 3, caused by using the paste in the lift-off technique are eliminated. Additionally, only one process step is necessary to structure the back side electrode.

Although the method of the present invention can be used to structure a thin-film solar module of, for example, amorphous silicon, as set forth hereinabove, the method of the present invention is not limited to such an application. For example, the method of the present invention can be used as a repair method for removing any remaining material residue, where individual laser pulses guarantee a reliable material erosion.

A number of other amorphous and polycrystalline semiconductor thin-films can be eroded in accordance with the principles of the method of the present invention, such as thin-films containing germanium or compound semiconductors, such as copper indium diselenide. Further, thin metal films on transparent substrates or layers can also be successfully eroded or structured in accordance with the principles of the method of the present invention.

In general, all thin-films that are applied onto adequately transparent substrates or layers and that have an adequate absorption for the laser light can be eroded in accordance with the principles of the method of the present invention. Only minimal thermal stress results in the non-eroded regions proceeding, for example, from the voltage-current characteristics, particularly in structuring modules. The electronic characteristics of the semiconductor material remain virtually unaltered, such that structuring the semiconductor material in accordance with the principles of the method of the present invention does not deteriorate the solar cell properties.

Although various minor modifications may be suggested by those versed in the art, it should be understood that we wish to embody within the scope of the patent granted hereon all such modifications as reasonably and properly come within the scope of our contribution to the art.

We claim:

1. A method for eroding material with a laser including the steps of:
   providing a thin-film structure including at least one thin-film over at least one transparent layer for laser irradiation, said thin-film structure being a thin-film solar cell; and
   irradiating said thin-film structure through said transparent layer with a laser pulse having a wavelength in an absorption range of said at least one thin-film for popping said thin-film structure off said at least one transparent layer in a region of said laser pulse and in order to form inactive regions.

2. A method as claimed in claim 1, further comprising the steps of focusing said laser pulse to a focal spot in said thin-film, and moving said laser pulse relative to said thin-film structure for forming a trench-shaped cutting line in said thin-film structure by successive, overlapping focal spot locations.

3. A method as claimed in claim 1, further comprising the step of positioning said transparent layer above said thin-film structure, such that said thin-film structure is popped off said transparent layer with the assistance of a gravitational force.

4. A method as claimed in claim 1, wherein said step of irradiating said thin-film structure is further defined by irradiating said thin-film structure through said transparent layer with a laser pulse having a wavelength in an absorption maximum of said at least one thin-film.

5. A method as claimed in claim 1, wherein said step of irradiating said thin-film is further defined by irradiating said thin-film structure through said transparent layer with a laser pulse having a pulse length of less than 200 ns.

6. A method as claimed in claim 1, wherein said step of irradiating said thin-film is further defined by irradiating said thin-film structure through said transparent layer with a laser pulse having a pulse length ranging from 200 ns through 100 ps.

7. A method as claimed in claim 1, wherein said step of irradiating said thin-film is further defined by irradiating said thin-film structure through said transparent layer with a laser pulse having a frequency ranging from 1 kHz through 100 kHz.

8. A method as claimed in claim 1, wherein said step of irradiating said thin-film is further defined by irradiating said thin-film structure through said transparent layer with a laser pulse produced by operating said laser in a $TEM_{00}$ mode.

9. A method as claimed in claim 1, further comprising the step of coupling undesired infrared radiation out of said beam path by interposing an optical arrangement in a beam path of said laser pulse.

10. A method for eroding material using a laser comprising the steps of:
   providing a thin-film structure including at least one thin-film arranged over at least one transparent layer for laser irradiation, said thin-film structure comprising a solar cell;
   selecting a laser pulse wavelength in an absorption range of said at least one thin-film; and
   irradiating said thin-film structure through said at least one transparent layer with a laser pulse for popping said thin-film structure off said at least one transparent layer in a region of said laser pulse and to form inactive layer regions in said thin-film structure.

* * * * *